(12) United States Patent
Gerardiere et al.

(10) Patent No.: US 11,059,455 B2
(45) Date of Patent: Jul. 13, 2021

(54) AUTHENTICATION READER FOR MOTOR VEHICLE OPENING ELEMENT

(71) Applicants: CONTINENTAL AUTOMOTIVE FRANCE, Toulouse (FR); CONTINENTAL AUTOMOTIVE GMBH, Hanovre (DE)

(72) Inventors: Olivier Gerardiere, Tournefeuille (FR); Xavier Hourné, Cugnaux (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/765,445

(22) PCT Filed: Nov. 16, 2018

(86) PCT No.: PCT/FR2018/052868
§ 371 (c)(1),
(2) Date: May 19, 2020

(87) PCT Pub. No.: WO2019/102113
PCT Pub. Date: May 31, 2019

(65) Prior Publication Data
US 2020/0317158 A1    Oct. 8, 2020

(30) Foreign Application Priority Data

Nov. 24, 2017  (FR) ...................... 1761150

(51) Int. Cl.
*B60R 25/24*   (2013.01)
*H04B 5/00*    (2006.01)

(52) U.S. Cl.
CPC ........... *B60R 25/24* (2013.01); *H04B 5/0056* (2013.01); *B60R 2325/103* (2013.01)

(58) Field of Classification Search
CPC .. B60R 25/24; B60R 2325/103; H04B 5/0056
See application file for complete search history.

(56) References Cited

U.S. PATENT DOCUMENTS 4,573,025 A   2/1986  McKinzie, III
5,796,180 A   8/1998  Glehr
(Continued)

FOREIGN PATENT DOCUMENTS

WO    98/27522 A1    6/1998

OTHER PUBLICATIONS

International Search Report, dated Feb. 19, 2019, from corresponding PCT application No. PCT/FR2018/052868.

*Primary Examiner* — Nabil H Syed
(74) *Attorney, Agent, or Firm* — Nixon & Vanderhye

(57) ABSTRACT

Disclosed is an authentication reader intended to be installed on a motor vehicle opening element, the reader including a microcontroller, at least one transmitter, at least one matching circuit and a single antenna, called "primary" antenna, characterized by a working frequency. The matching circuit includes switching element able to switch the matching circuit between a first mode, in which the matching circuit makes it possible to match the primary antenna to a secondary antenna of an authentication device whose resonant frequency is lower than the working frequency, and a second mode, in which the matching circuit makes it possible to match the primary antenna to a secondary antenna of an authentication device whose resonant frequency is higher than the working frequency.

20 Claims, 3 Drawing Sheets

(56) References Cited

U.S. PATENT DOCUMENTS

| | | |
|---|---|---|
| 2005/0258966 A1 | 11/2005 | Quan |
| 2008/0309566 A1 | 12/2008 | Russ |
| 2013/0293348 A1 | 11/2013 | Obergfell |
| 2017/0288734 A1* | 10/2017 | Zhou .................... H04B 5/0056 |
| 2019/0057293 A1* | 2/2019 | Butera ..................... H03J 7/04 |

* cited by examiner

AUTHENTICATION READER FOR MOTOR VEHICLE OPENING ELEMENT

BACKGROUND OF THE INVENTION

Field of the Invention

The present invention relates to the field of unlocking the opening elements of a motor vehicle and relates more particularly to an authentication reader intended to be installed in an opening element of a motor vehicle and to an authentication method using such a reader.

Description of the Related Art

Nowadays, it is known to install a near-field communication reader in a motor vehicle opening element, for example on a door handle, in order to allow authentication of a user using a device and unlocking of said opening element.

Near-field communication (NFC) is based on a short-range and high-frequency, for example 13.56 MHz, wireless communication technology allowing the exchange of information between peripherals up to a distance of a few centimeters, for example of the order of 5 cm.

In practice, when the user of a vehicle wishes to unlock the opening elements thereof, he first of all places his authentication device close to the reader. The reader then detects the presence of the device, and then authenticates it and unlocks one or all of the opening elements of the vehicle when authentication is successful.

In one known solution, the reader comprises what is called a "primary" antenna and the device comprises what is called a "secondary" antenna. The reader is configured so as to periodically send, via said primary antenna, an electrical signal in the form of a pulse of short duration, for example a few tens of microseconds. The device may be passive or active. A passive device may for example be a card or a fob, whereas an active device may for example be a smartphone or a fob.

When the device comes close enough to the reader, for example within 10 cm, the presence of the secondary antenna modifies the voltage across the terminals of the primary antenna. This modification is detected by the reader, which deduces therefrom that a compatible device is nearby, and then authenticates said device by obtaining and confirming an identifier stored in a memory area of the device.

FIG. 1 schematically shows one known solution for an authentication reader 1A. In this solution, the authentication reader 1A comprises a microcontroller 10A, a transmitter 20A, a matching circuit 30A and a primary antenna L3. The microcontroller 10A controls the transmitter 20A so that it excites the primary antenna L3 by way of the matching circuit 30A. The matching circuit 30A makes it possible to optimize the transfer of the electric power generated by the transmitter 20A between the primary antenna L3 (source) and the secondary antenna (load, not shown).

To this end, the matching circuit 30A comprises a first branch, connected firstly to the transmitter 20A via a first input terminal E1 and secondly to the primary antenna L3 via a first output terminal S1, and a second branch, connected firstly to the transmitter 20A via a second input terminal E2 and secondly to the primary antenna L3 via a second output terminal S2. The primary antenna L3 is connected between the first output terminal S1 and the second output terminal S2. The first branch comprises an inductor L1 and a capacitor C1. A capacitor C2 is connected in parallel with a resistor R1 between the first output terminal S1 and ground M. A capacitor C3 is connected between the center tap of the inductor L1 and the capacitor C1 and ground M. The second branch comprises an inductor L2 and a capacitor C4. A capacitor C5 is connected in parallel with a resistor R2 between the second output terminal S2 and ground M. A capacitor C6 is connected between the center tap of the inductor L2 and the capacitor C4 and ground M. The inductor L1 and the capacitor C3 form a first "LC" filter and the inductor L2 and the capacitor C6 form a second "LC" filter.

For example:
$L1=L2=220$ nH
$C3=C6=1$ nF
$C1=C4=128$ pF
$C2=C5=47$ pF
$R1=R2=5.1$ kΩ
$L3=1.7$ µH The nature of authentication devices may however vary significantly depending on their type (passive fob, active smartphone, etc.) and each device has settings specific to its secondary antenna, in particular its resonant frequency, its quality factor and its level of coupling with the primary antenna. The modification of the voltage across the terminals of the primary antenna by the device thus depends on the nature of said device. In particular, some authentication devices will reduce the voltage across the terminals of the primary antenna, whereas others will increase it, in particular depending on whether their resonant frequency is lower or higher than the working frequency of the primary antenna. It then becomes difficult to design a reader such that it operates with a wide range of authentication devices working at significantly different resonant frequencies.

There is therefore a need for a simple and effective reader solution that operates with a wide variety of authentication devices.

SUMMARY OF THE INVENTION

The invention relates first of all to an authentication reader intended to be installed on a motor vehicle opening element, said reader comprising a microcontroller, at least one transmitter, at least one matching circuit and a single antenna, called "primary" antenna, characterized by a working frequency. The reader is noteworthy in that the matching circuit comprises switching means able to switch said matching circuit between a first mode, in which the matching circuit makes it possible to match the primary antenna to a secondary antenna of an authentication device whose resonant frequency is lower than the working frequency, and a second mode in which the matching circuit makes it possible to match the primary antenna to a secondary antenna of an authentication device whose resonant frequency is higher than the working frequency.

The invention thus advantageously allows the reader to match its primary antenna both to secondary antennas whose resonant frequencies are lower than the working frequency and to secondary antennas whose resonant frequencies are higher than the working frequency, thus making it possible to authenticate of a wide range of devices.

In a first embodiment, the matching circuit comprises a first branch connected firstly to the transmitter via a first input terminal and secondly to the primary antenna via an output terminal and comprising a first capacitor, the primary antenna also being connected to ground, the matching circuit furthermore comprising a second capacitor connected firstly to the output terminal and secondly to ground, and a second branch connected firstly to the transmitter via a second input terminal and secondly to the primary antenna at the output terminal and comprising a first capacitor, the matching circuit furthermore comprising a second capacitor connected firstly to the output terminal and secondly to ground, and wherein the switching means are in the form of a switching branch connected in parallel with the primary antenna and comprising a switching capacitor connected in series with a switch.

Preferably, the switch is commanded by the microcontroller or by the transmitter.

Advantageously, the first branch furthermore comprises an inductor, connected between the first input terminal and the first capacitor, and a third capacitor, connected between the center tap of said inductor and of the first capacitor and ground.

Again advantageously, the second branch furthermore comprises an inductor, connected between the second input terminal and the first capacitor, and a third capacitor, connected between the center tap of said inductor and of the first capacitor and ground.

Preferably, the matching circuit furthermore comprises a resistor connected in parallel with the primary antenna between the output terminal and ground.

In a second embodiment, the switching means comprise a first switch and a second switch and the matching circuit comprises a branch connected firstly to the transmitter via an input terminal and secondly to the primary antenna via an output terminal, said branch comprising the first switch, a first capacitor and the second switch, the first switch being connected to the input terminal and being able to switch between a first connection point to the first capacitor and a second connection point to ground, the matching circuit comprising a second capacitor and a third capacitor, the second switch being connected firstly to the output terminal and being able to switch between a first connection point situated at the center tap between the first capacitor and the second capacitor and a second connection point situated at the center tap between the second capacitor and the third capacitor, the third capacitor also being connected to ground, the primary antenna being connected between the output terminal and ground.

Preferably, the first switch and the second switch are commanded by the microcontroller or by the transmitter.

Advantageously, the branch furthermore comprises an inductor, connected between the input terminal and the first switch, a fourth capacitor, connected between the first connection point and the second connection point of the first switch, and a fifth capacitor, connected between the second connection point of the first switch and ground.

Again advantageously, the reader furthermore comprises a resistor connected in parallel with the primary antenna, between the output terminal and ground.

The invention also relates to a motor vehicle comprising at least one opening element, said opening element comprising an authentication reader as presented above.

The invention also relates to an authentication system for locking or unlocking at least one opening element of a motor vehicle, said system comprising at least one authentication device and a motor vehicle as presented above.

The invention relates finally to a method for authenticating a device by way of a reader installed in an opening element of a motor vehicle, said reader comprising a microcontroller, at least one transmitter, at least one matching circuit and a single antenna, called "primary" antenna, characterized by a working frequency, said method, implemented by said reader, being characterized in that it alternately comprises the steps of matching, by way of the matching circuit, the primary antenna to a secondary antenna of a device whose resonant frequency is lower than the working frequency, and matching, by way of the matching circuit, the primary antenna to a secondary antenna of a device whose resonant frequency is higher than the working frequency.

Other features and advantages of the invention will become apparent from the following description, provided with reference to the appended figures which are given by way of non-limiting example and in which identical reference signs are given to similar objects.

BRIEF DESCRIPTION OF THE DRAWINGS

FIG. 2 schematically shows a near-field communication authentication system 0 according to the invention.

DESCRIPTION OF THE PREFERRED EMBODIMENTS

In this example, the system 0 comprises a first authentication device 2-1, for example a passive near-field communication fob, and a second authentication device 2-2, for example an active near-field communication smartphone. The system 0 also comprises an authentication reader 1B-1, 1B-2 installed in an opening element of a motor vehicle (not shown), for example in a door or a trunk, in particular in a door handle.

Figure 1:
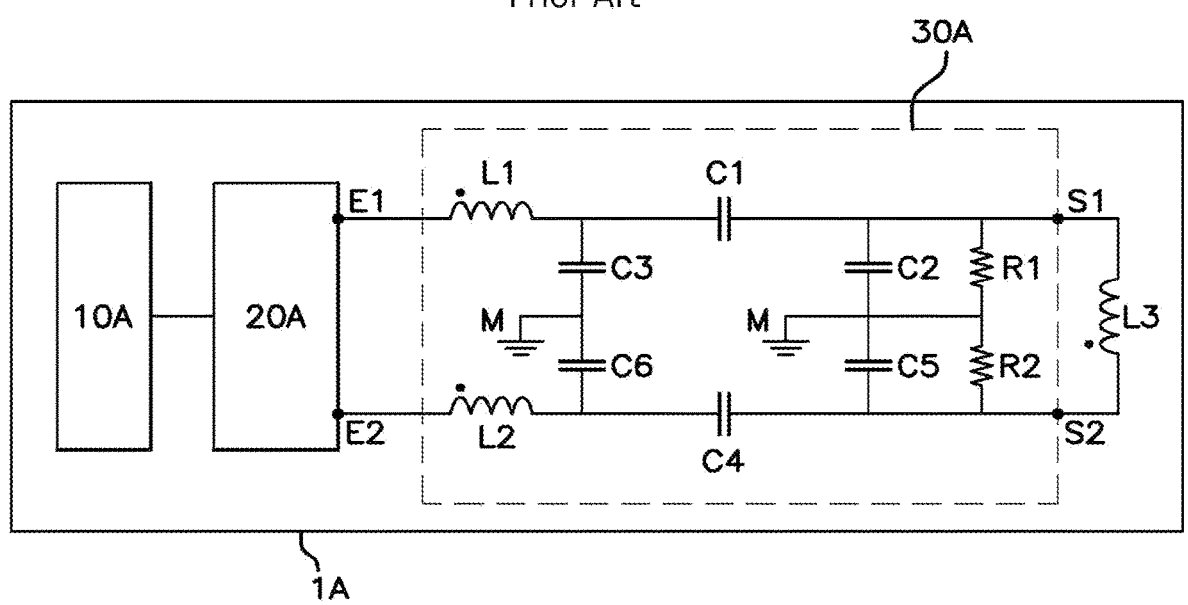
FIG. 1 schematically illustrates one embodiment of a reader from the prior art.
Figure 2:
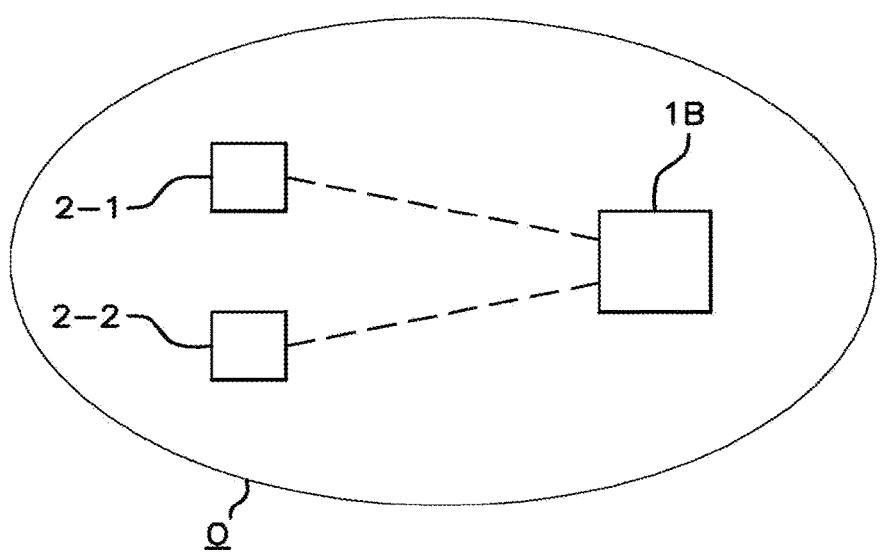
FIG. 2 schematically illustrates one embodiment of the system according to the invention.
Figure 3:
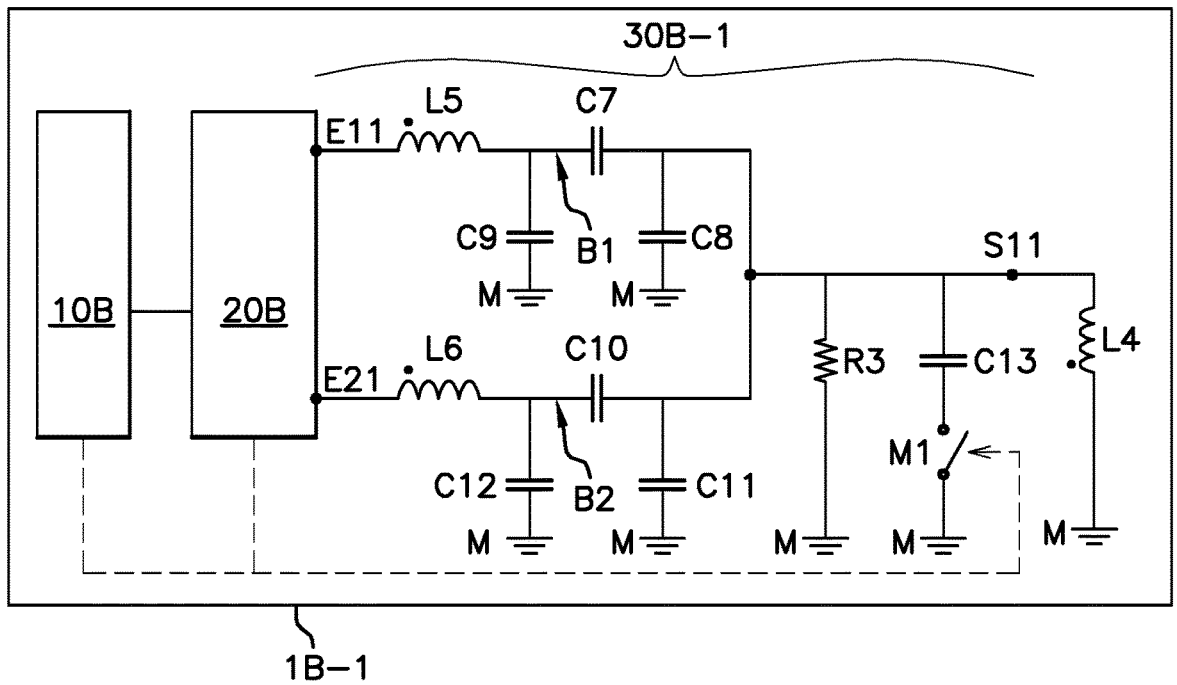
FIG. 3 schematically illustrates a first embodiment of the reader according to the invention.
Figure 4:
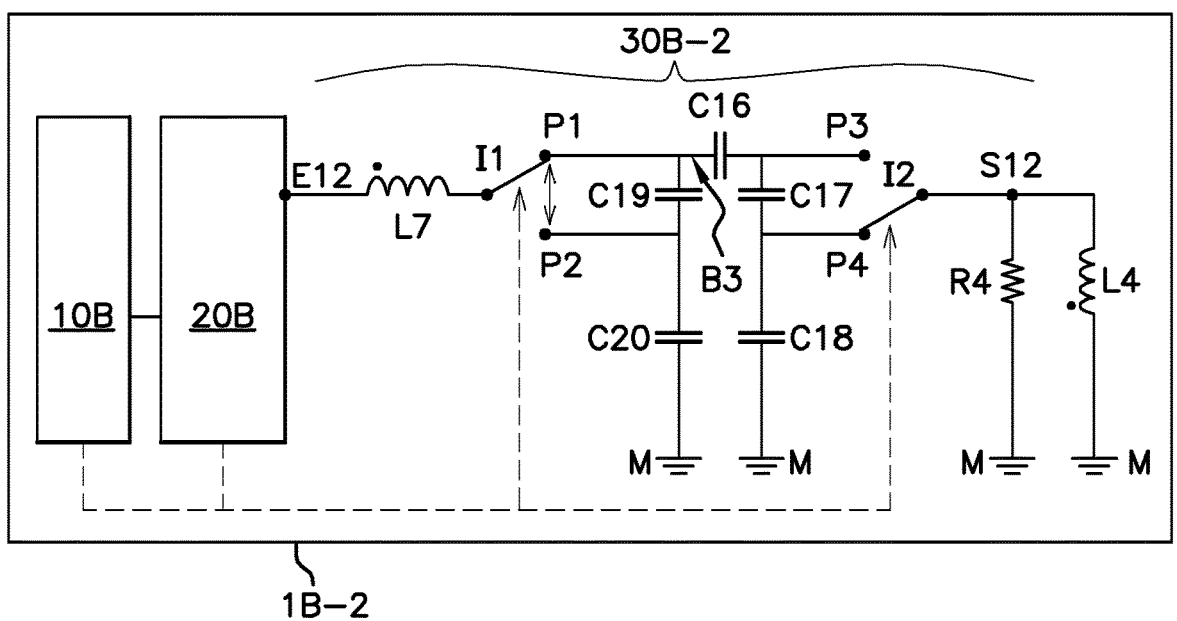
FIG. 4 schematically illustrates a second embodiment of the reader according to the invention.

With reference to FIGS. 3 and 4, the reader 1B-1, 1B-2 comprises a microcontroller 10B, a transmitter 20B, a matching circuit 30B-1, 30B-2 and a single antenna, called "primary" antenna (L4), characterized by a working frequency, for example 13.56 MHz. It will be noted that the microcontroller 10B and the transmitter 20B may be separate physical entities or be implemented by the same physical entity.

The matching circuit 30B-1, 30B-2 comprises switching means able to switch said matching circuit 30B-1, 30B-2 between a first mode, in which the matching circuit 30B-1, 30B-2 makes it possible to match the primary antenna L4 to a secondary antenna of an authentication device 2-1, 2-2 whose resonant frequency is lower than the working frequency, and a second mode, in which the matching circuit 30B-1, 30B-2 makes it possible to match the primary antenna L4 to a secondary antenna of an authentication device 2-1, 2-2 whose resonant frequency is higher than the working frequency.

FIGS. 3 and 4 schematically show two embodiments of the authentication reader 1B-1, 1B-2 according to the invention.

First of all, in the first embodiment illustrated in FIG. 3, the matching circuit 30B-1 comprises a first branch B1 and a second branch B2. The first branch B1 is connected firstly to the transmitter 20B via a first input terminal E11 and secondly to the primary antenna L4 via an output terminal S11. The second branch B2 is connected firstly to the transmitter 20B via a second input terminal E21 and secondly to the primary antenna L4 at the output terminal S11. The primary antenna L4 is connected between the output terminal S11 and ground M.

The first branch B1 first of all comprises an inductor L5 connected firstly to the first input terminal E11 and secondly to a first capacitor C7, the first capacitor C7 also being connected to the output terminal S11. A second capacitor C8 is connected between the output terminal S11 and ground M. A third capacitor C9 is connected between the center tap of the inductor L5 and the first capacitor C7 and ground M. The inductor L5 and the third capacitor C9 (which are optional) advantageously form an LC filter making it possible to reject low-frequency and high-frequency signals.

The second branch B2 first of all comprises an inductor L6 connected firstly to the second input terminal E21 and secondly to a first capacitor C10, the first capacitor C10 also being connected to the output terminal S11. A second capacitor C11 is connected between the output terminal S11 and ground M. A third capacitor C12 is connected between the center tap of the inductor L6 and the first capacitor C10 and ground M. The inductor L6 and the third capacitor C12 (which are optional) advantageously form an LC filter making it possible to reject low-frequency and high-frequency signals.

In this example, the matching circuit 30B-1 furthermore comprises a resistor R3 connected between the output terminal S11 and ground M, that is to say connected in parallel with the primary antenna L4. This resistor R3 makes it possible to adjust the quality factor of the primary antenna L4.

In this first embodiment, the switching means are in the form of a switching branch connected in parallel with the primary antenna L4 (and therefore also with the resistor R3) and comprising a switching capacitor C13 connected in series with a two-position switch M1

(open or closed). In this example, the switch M1 is a MOSFET transistor, but any other suitable type of switch could be used. One of the microcontroller 10B or the transmitter 20B is configured so as to command the switch M1 periodically, for example every 200 ms.

The values of the components of the matching circuit 30B-1, in particular of the capacitors C7, C8, C10 and C11, are chosen such that the primary antenna L4 is matched to a secondary antenna whose resonant frequency is lower than the working frequency when the switch M1 is in one position, and matched to a secondary antenna whose resonant frequency is higher than the working frequency of the primary antenna L4 when the switch M1 is in its other position (for example the switch M1 is closed when the input terminal E11 is active).

For example:
L4=1 µH
L5=220 nH
L6=1.5 µH
C7=36 pF
C8=9 pF
C9=100 pF
C10=22 pF
C11=76 pF
C12=100 pF
C13=12 pF
R3=2 kΩ

In the second embodiment illustrated in FIG. 4, the switching means comprise a first two-position switch I1 and a second two-position switch I2, for example of MOSFET transistor type.

The first switch I1 is able to switch between a first connection point P1 and a second connection point P2.

Similarly, the second switch I2 is able to switch between a first connection point P3 and a second connection point P4.

One of the microcontroller 10B or the transmitter 20B is configured so as to command the first switch I1 and the second switch I2 simultaneously and periodically, for example every 200 ms.

The matching circuit 30B-2 is connected firstly to the transmitter 20B at an input terminal E12 and secondly to the primary antenna L4 at an output terminal S12.

The matching circuit 30B-2 first of all comprises an inductor L7 connected firstly to the input terminal E12 and secondly to the first switch I1.

The first connection point P1 of the first switch I1 is connected to a first capacitor C16, which is also connected to the first connection point P3 of the second switch I2.

The matching circuit 30B-2 comprises a second capacitor C17 and a third capacitor C18. The second capacitor C17 is connected firstly to the first capacitor C16, at the first connection point P3 of the second switch I2, and secondly to the third capacitor C18, at the second connection point P4 of the second switch I2, the third capacitor C18 also being connected to ground M.

The matching circuit 30B-2 furthermore comprises a fourth capacitor C19, connected between the first connection point P1 and the second connection point P2 of the first switch I1, and a fifth capacitor C20, connected between the second connection point P2 of the first switch I1 and ground M.

The inductor L7, the fourth capacitor C19 and the fifth capacitor C20 (which are optional) advantageously form an LC filter making it possible to reject low-frequency and high-frequency signals.

In this example, the matching circuit 30B-2 furthermore comprises a resistor R4 connected between the output terminal S12 and ground M, that is to say connected in parallel with the primary antenna L4. This resistor R4 makes it possible to reject low-frequency and high-frequency signals.

The values of the components of the matching circuit 30B-2, in particular of the capacitors C16, C17 and C18, are chosen such that the primary antenna L4 is matched to a secondary antenna whose resonant frequency is lower than the working frequency when the first switch I1 and the second switch I2 are in a first configuration, and matched to a secondary antenna whose resonant frequency is higher than the working frequency of the primary antenna L4 when the first switch I1 and the second switch I2 are in a second configuration, as will be described below.

For example:
The capacitors C19 in series with C20 have an equivalent capacitance of 180 pF
The capacitors C16 in series with C17 have an equivalent capacitance of 74 pF
C18=258 pF
C20=1 nF
The capacitors C19 in series with C16 have an equivalent capacitance of 234 pF
The capacitors C17 in series with C18 have an equivalent capacitance of 153 pF
R4=3.3 KΩ
L4=0.78 µH
L7=220 nH The invention will now be described in terms of the implementation thereof with reference to FIGS. 5 to 7.

Figure 5:
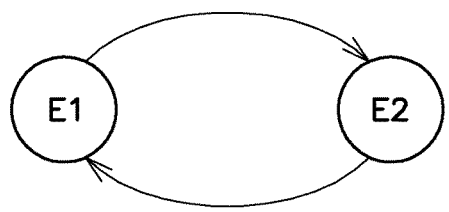
FIG. 5 schematically illustrates one embodiment of the method according to the invention.

With reference first of all to FIG. 5, the implementation of the invention consists in the microcontroller 10B commanding the transmitter 20B such that it generates at least one electric current in the matching circuit 30B-1, 30B-2 allowing the primary antenna L4 to alternately send a first electrical signal to the secondary antenna of an authentication device 2-1, 2-2 in a step E1 during which the matching circuit 30B-1, 30B-2 operates in a first mode, and a second electrical signal to the secondary antenna of an authentication device 2-1, 2-2 in a step E2 during which the matching circuit 30B-1, 30B-2 operates in a second mode, the first mode and the second mode being defined by the position of the switching means.

In a first mode of implementation relating to the first embodiment of the reader 1B-1 (cf. FIG. 3), the microcontroller 10B or the transmitter 20B commands the switch M1 so that it is alternately open or closed, such that the matching circuit 30B-1 makes it possible to alternately match the primary antenna L4 to two types of secondary antennas, as explained above.

In a second mode of implementation relating to the second embodiment of the reader 1B-2 (cf. FIG. 4), the microcontroller 10B or the transmitter 20B commands the first switch I1 and the second switch I2 simultaneously and periodically such that the matching circuit 30B-2 operates alternately in a first mode or in a second mode.

Figure 6:
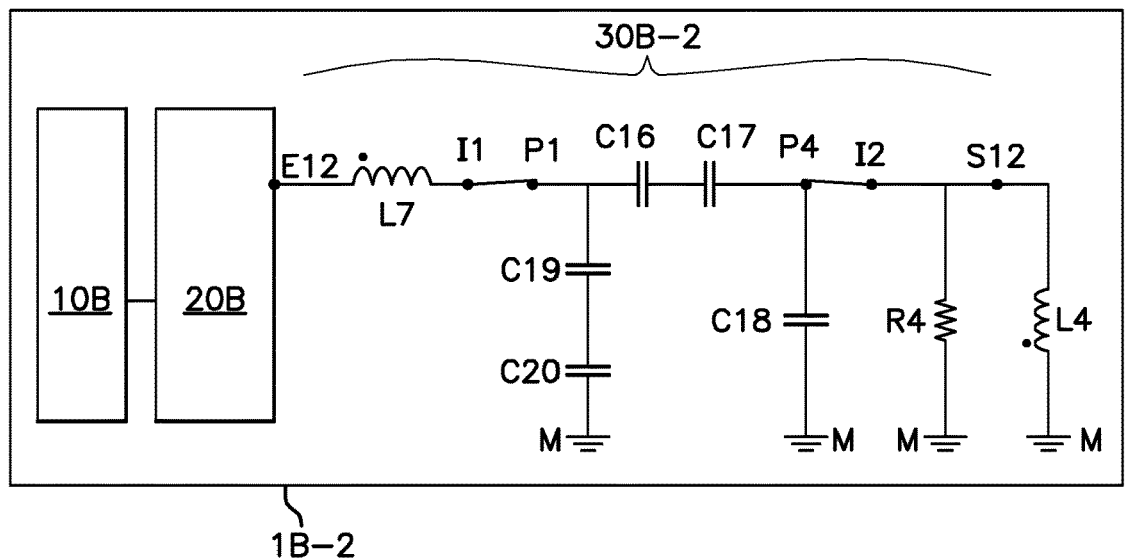
FIG. 6 schematically illustrates a first operating mode of the reader from FIG. 4.

With reference to FIG. 6, which illustrates the operation of the circuit of the second embodiment of the reader 1B-2, the first mode is defined by the position of the first switch I1 in which the inductor L7 is connected to the first capacitor C16 and by the position of the second switch I2 in which the center tap P1 of the second capacitor C17 and of the third capacitor C18 (i.e. corresponding to the second connection point P4 of the second switch I2) is connected to the output terminal S12.

In this case, as illustrated in FIG. 6, the matching circuit 30B-2 comprises:
  the LC filter consisting of the inductor L7 and a branch where the fourth capacitor C19 and the fifth capacitor C20 are in series and connected to ground M,
  the first capacitor C16 and the second capacitor C17 connected in series firstly to the inductor L7 (via the first switch I1 and the point P1) and secondly to the output terminal S12 (via the second switch I2 and the point P4),
  the third capacitor C18, the resistor R4 and the primary antenna L4, all three of them connected in parallel between the output terminal S12 and ground M.

Figure 7:
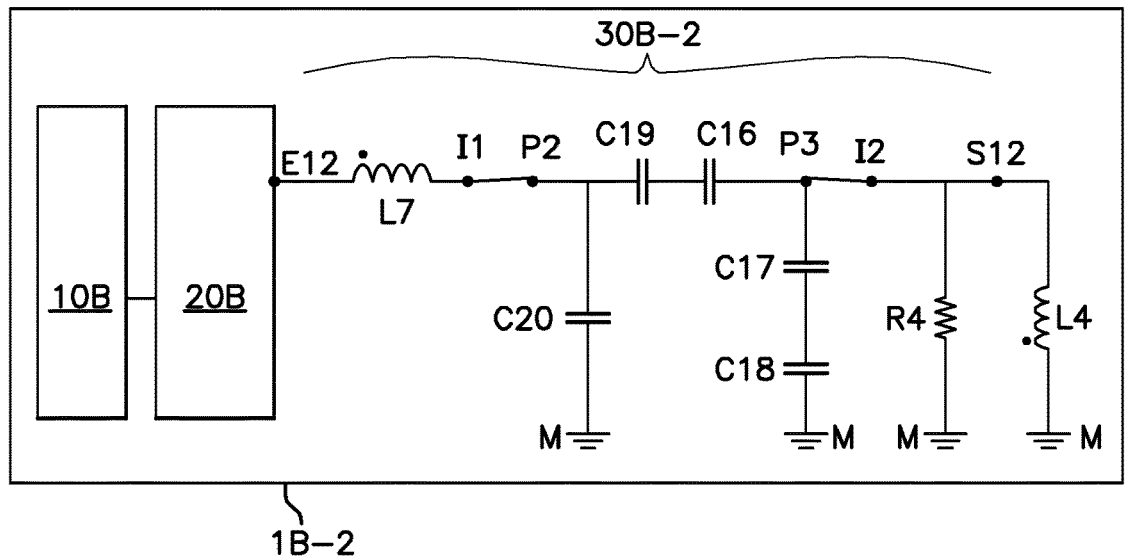
FIG. 7 schematically illustrates a second operating mode of the reader from FIG. 4.

With reference to FIG. 7, the second mode is defined by the position of the first switch I1 in which the inductor L7 is connected to the center tap P2 between the fourth capacitor C19 and the fifth capacitor C20 and by the position of the second switch I2 in which the center tap of the first capacitor C16 and of the second capacitor C17 (i.e. corresponding to the second connection point P3 of the second switch I2) is connected to the output terminal S12.

In this case, as illustrated in FIG. 7, the matching circuit 30B-2 comprises:
  the LC filter consisting of the inductor L7 and the fifth capacitor C20,
  the fourth capacitor C19 and the first capacitor C16 connected in series firstly to the inductor L7 (via the first switch I1 and the point P2) and secondly to the output terminal S12 (via the second switch I2 and the point P3),
  a branch (comprising the second capacitor C17 and the third capacitor C18 connected in series), the resistor R4 and the primary antenna L4, all three of them connected in parallel between the output terminal S12 and ground M.

Alternately using the two modes advantageously makes it possible to match the primary antenna L4 alternately to a secondary device antenna 2-1, 2-2 operating at a resonant frequency lower than the working frequency of the primary antenna L4 and to a secondary device antenna 2-1, 2-2 operating at a resonant frequency higher than the working frequency of the primary antenna L4. The switching frequency between the first mode and the second mode is chosen so as to allow rapid detection of one or the other type of device 2-1, 2-2 (switching may for example be performed several times per second).

The invention claimed is:

1. An authentication reader (1B-1, 1B-2) for a motor vehicle opening element, said authentication reader (1B-1, 1B-2) comprising:
  a microcontroller (10B);
  at least one transmitter (20B);
  at least one matching circuit (30B-1, 30B-2); and
  a single primary antenna (L4) characterized by a working frequency,
  the matching circuit (30B-1, 30B-2) comprising switching means (M1; I1, I2) able to switch said matching circuit (30B-1, 30B-2) between a first mode in which the matching circuit (30B-1, 30B-2) permits the primary antenna (L4) to match a secondary antenna of an authentication device (2-1, 2-2) having a resonant frequency lower than the working frequency, and a second mode in which the matching circuit (30B-1, 30B-2) permits the primary antenna (L4) to match a secondary antenna of an authentication device (2-1, 2-2) having a resonant frequency higher than the working frequency,
  wherein the matching circuit (30B-1) comprises:
    a first branch (B1) connected to the transmitter (20B) via a first input terminal (E11) and to the primary antenna (L4) via an output terminal (S11) and comprising a first capacitor (C7), the primary antenna (L4) also being connected to ground (M), the matching circuit (30B-1) furthermore comprising a second capacitor (C8) connected to the output terminal (S11) and to the ground (M), and
    a second branch (B2) connected to the transmitter (20B) via a second input terminal (E21) and to the primary antenna (L4) at the output terminal (S11) and comprising a first capacitor (010), the matching circuit (30B-1) furthermore comprising a second capacitor (C11) connected to the output terminal (S11) and to the ground (M),
  and wherein the switching means are in the form of a switching branch connected in parallel with the primary antenna (L4) and comprising a switching capacitor (C13) connected in series with a switch (M1).

2. The authentication reader (1B-1) as claimed in claim 1, wherein the switch (M1) is commanded by the microcontroller (10B) or by the transmitter (20B).

3. The authentication reader (1B-1) as claimed in claim 1, wherein the first branch (B1) furthermore comprises an inductor (L5), connected between the first input terminal (E11) and the first capacitor (C7), and a third capacitor (C9), connected between the center tap of said inductor (L5) and of the first capacitor (C7) and the ground (M).

4. The authentication reader (1B-1) as claimed in claim 1, wherein the second branch (B2) furthermore comprises an inductor (L6), connected between the second input terminal (E21) and the first capacitor (C10), and a third capacitor (C12), connected between the center tap of said inductor (L6) and of the first capacitor (C10) and the ground (M).

5. The authentication reader (1B-1) as claimed in claim 1, wherein the matching circuit (30B-1) furthermore comprises a resistor (R3) connected in parallel with the primary antenna (L4) between the output terminal (S11) and the ground (M).

6. A motor vehicle, comprising at least one opening element, said opening element comprising an authentication reader (1B) as claimed in claim 1.

7. An authentication system (0) for locking or unlocking at least one opening element of a motor vehicle, said system (0) comprising at least one authentication device (2-1, 2-2) and a motor vehicle as claimed in claim 6.

8. The authentication reader (1B-1) as claimed in claim 2, wherein the first branch (B1) furthermore comprises an inductor (L5), connected between the first input terminal (E11) and the first capacitor (C7), and a third capacitor (C9), connected between the center tap of said inductor (L5) and of the first capacitor (C7) and the ground (M).

9. The authentication reader (1B-1) as claimed in claim 2, wherein the second branch (B2) furthermore comprises an inductor (L6), connected between the second input terminal (E21) and the first capacitor (C10), and a third capacitor (C12), connected between the center tap of said inductor (L6) and of the first capacitor (C10) and the ground (M).

10. The authentication reader (1B-1) as claimed in claim 3, wherein the second branch (B2) furthermore comprises an inductor (L6), connected between the second input terminal (E21) and the first capacitor (010), and a third capacitor (C12), connected between the center tap of said inductor (L6) and of the first capacitor (010) and the ground (M).

11. The authentication reader (1B-1) as claimed in claim 2, wherein the matching circuit (30B-1) furthermore comprises a resistor (R3) connected in parallel with the primary antenna (L4) between the output terminal (S11) and the ground (M).

12. The authentication reader (1B-1) as claimed in claim 3, wherein the matching circuit (30B-1) furthermore comprises a resistor (R3) connected in parallel with the primary antenna (L4) between the output terminal (S11) and the ground (M).

13. The authentication reader (1B-1) as claimed in claim 4, wherein the matching circuit (30B-1) furthermore comprises a resistor (R3) connected in parallel with the primary antenna (L4) between the output terminal (S11) and the ground (M).

14. A motor vehicle comprising at least one opening element, said opening element comprising an authentication reader (1B) as claimed in claim 2.

15. A motor vehicle comprising at least one opening element, said opening element comprising an authentication reader (1B) as claimed in claim 3.

16. A motor vehicle comprising at least one opening element, said opening element comprising an authentication reader (1B) as claimed in claim 4.

17. A motor vehicle comprising at least one opening element, said opening element comprising an authentication reader (1B) as claimed in claim 5.

18. The authentication reader (1B-1) as claimed in claim 8, wherein the second branch (B2) furthermore comprises an inductor (L6), connected between the second input terminal (E21) and the first capacitor (C10), and a third capacitor (C12), connected between the center tap of said inductor (L6) and of the first capacitor (C10) and the ground (M).

19. The authentication reader (1B-1) as claimed in claim 8, wherein the matching circuit (30B-1) furthermore comprises a resistor (R3) connected in parallel with the primary antenna (L4) between the output terminal (S11) and the ground (M).

20. The authentication reader (1B-1) as claimed in claim 9, wherein the matching circuit (30B-1) furthermore comprises a resistor (R3) connected in parallel with the primary antenna (L4) between the output terminal (S11) and the ground (M).

* * * * *